United States Patent
Paulson

(10) Patent No.: US 9,328,422 B2
(45) Date of Patent: May 3, 2016

(54) CRYSTALLIZATION AND BLEACHING OF DIAMOND-LIKE CARBON AND SILICON OXYNITRIDE THIN FILMS

(71) Applicant: CORNING INCORPORATED, Corning, NY (US)

(72) Inventor: Charles Andrew Paulson, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 14/193,173

(22) Filed: Feb. 28, 2014

(65) Prior Publication Data

US 2014/0255616 A1    Sep. 11, 2014

Related U.S. Application Data

(60) Provisional application No. 61/773,434, filed on Mar. 6, 2013.

(51) Int. Cl.
| | |
|---|---|
| B05D 3/00 | (2006.01) |
| C08J 7/18 | (2006.01) |
| G21H 5/00 | (2006.01) |
| C23C 16/56 | (2006.01) |
| C23C 16/26 | (2006.01) |
| C23C 16/30 | (2006.01) |
| C23C 14/58 | (2006.01) |

(52) U.S. Cl.
CPC .............. *C23C 16/56* (2013.01); *C23C 14/5813* (2013.01); *C23C 16/26* (2013.01); *C23C 16/308* (2013.01)

(58) Field of Classification Search
CPC ........ C23C 16/24; C23C 16/26; C23C 16/27; C23C 16/56; C23C 16/272; C23C 16/308; C23C 16/401
USPC .......................................... 427/553, 554, 558
See application file for complete search history.

(56) References Cited

U.S. PATENT DOCUMENTS

| | | | | |
|---|---|---|---|---|
| 4,849,199 A | * | 7/1989 | Pinneo | B01J 19/121 117/103 |
| 4,933,206 A | * | 6/1990 | Cox | 427/558 |
| 5,328,855 A | * | 7/1994 | Kitabatake | H01L 21/268 117/929 |

(Continued)

FOREIGN PATENT DOCUMENTS

| | | | | |
|---|---|---|---|---|
| EP | 1783519 A1 | 5/2007 | | G02B 3/00 |
| JP | 2007210821 A | 8/2007 | | C30B 29/04 |

(Continued)

OTHER PUBLICATIONS

XP002723872, Mar. 28, 2011, EP.

(Continued)

*Primary Examiner* — Michael Wieczorek
(74) *Attorney, Agent, or Firm* — Payal A. Patel

(57) ABSTRACT

Optically transparent diamond-like carbon (DLC) thin films are formed using relatively low-temperature deposition conditions followed by a post-deposition bleaching step. The bleaching can include exposure of an as-deposited thin film to UV laser radiation, which reduces the concentration of defects in the film. The method is compatible with temperature-sensitive substrates, and can be used to form water clear DLC layers on glass substrates, for example, which can be used in display applications.

13 Claims, 2 Drawing Sheets

(56) References Cited

U.S. PATENT DOCUMENTS

| | | | |
|---|---|---|---|
| 6,713,179 B2 * | 3/2004 | Veerasamy | 428/408 |
| 7,491,658 B2 * | 2/2009 | Nguyen et al. | 438/789 |
| 7,807,225 B2 * | 10/2010 | Joshi et al. | 427/255.394 |
| 2006/0228871 A1 | 10/2006 | Wajda et al. | 438/478 |
| 2008/0164808 A1 * | 7/2008 | Kim et al. | 313/504 |
| 2011/0256726 A1 | 10/2011 | LaVoie et al. | 438/702 |

FOREIGN PATENT DOCUMENTS

| | | | | |
|---|---|---|---|---|
| JP | 2008247639 A | 10/2008 | | C03C 23/00 |
| WO | 2009023263 A1 | 2/2009 | | H01L 31/00 |
| WO | WO2013169427 A1 | 11/2013 | | C23C 16/44 |
| WO | 2014088989 A3 | 6/2014 | | |

OTHER PUBLICATIONS

Patent Cooperation Treaty International Notification of Transmittal of the International Search Report and the Written Opinion of the International Searching Authority, international application No. PCT/US2014/019852: mailing date May 16, 2014, 11 pages.

Patent Cooperation Treaty International Notification of Transmittal of the International Preliminary Report of Patentability Report on Patentability (Chapter I of the Patent Cooperation Treaty) of the International Searching Authority, international application No. PCT/US2014/019852: mailing date Sep. 2015, 10 pages.

Yeh et al., Excimer Laser Annealing of Low Temperature Semitransparent Silicon Oxynitride Gate Insulator, IDMC, pp. 462-464, 2005.

* cited by examiner

CRYSTALLIZATION AND BLEACHING OF DIAMOND-LIKE CARBON AND SILICON OXYNITRIDE THIN FILMS

CROSS-REFERENCE TO RELATED APPLICATIONS

This application claims the benefit of priority under 35 U.S.C. §119 of U.S. Provisional Application Ser. No. 61/773,434 filed on Mar. 6, 2013, the content of which is relied upon and incorporated herein by reference in its entirety.

BACKGROUND

The present disclosure relates generally to diamond-like carbon (DLC) and silicon oxynitride ($SiO_xN_y$), and more particularly to a low temperature process for forming optically transparent DLC and $SiO_xN_y$ thin films on a substrate.

Diamond-like carbon, silicon oxynitride and other high-hardness thin films can be produced using various techniques, including sputtering and filtered cathodic arc deposition. DLC and $SiO_xN_y$ films, for instance, have been investigated primarily for their tribological properties for use as wear-resistant coatings. Diamond-like carbon and silicon oxynitride are lubricious and hard and can beneficially extend the wear life of a workpiece such as a tool bit.

In the various tribological applications, the optical properties of diamond-like carbon and $SiO_xN_y$ are not typically paramount. DLC-based supermarket scanners, for example, which are beneficially scratch-resistant, generally have a yellow hue. In other applications, however, such as in wear resistant coatings for lenses and displays, transparency and color can be important properties.

It is believed that the optical transparency of DLC and $SiO_xN_y$ thin films can be improved in situ, i.e., during formation of the films, by increasing the deposition temperature. On the other hand, thin films formed at lower deposition temperatures typically include defects such as graphitic deposits that adversely affect their clarity.

Thus, as the temperature of the deposition increases, various techniques can be used to produce increasingly water-clear DLC or $SiO_xN_y$ thin films. However, such high deposition temperatures are generally unsuitable for many temperature-sensitive substrates such as glass substrates.

Based on the foregoing, it would be desirable to form optically-transparent diamond-like carbon and silicon oxynitride thin films using a low temperature process that is compatible with glass and other temperature-sensitive substrates.

SUMMARY

Disclosed herein are methods for forming an optically-transparent, i.e., water clear diamond-like carbon (DLC) thin film or an optically-transparent $SiO_xN_y$ thin film. A DLC or $SiO_xN_y$ thin film can be initially formed on a supporting substrate using a relatively low-temperature deposition process. Defects that are formed in the as-deposited thin film and which adversely affect the optical properties of the thin film can be eliminated using a post-deposition bleaching step. The bleaching step can include irradiating a defect-containing thin film with ultraviolet radiation to reduce a concentration of the defects within the film and form an optically transparent diamond-like carbon or $SiO_xN_y$ thin film on an underlying substrate.

Additional features and advantages will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

DETAILED DESCRIPTION

Figure 1:
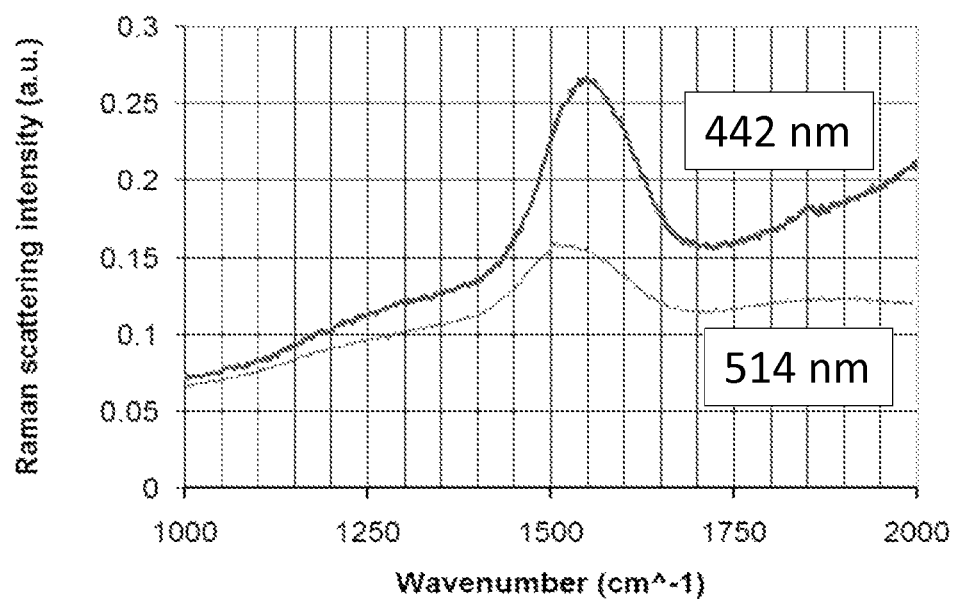
FIG. 1 shows Raman spectra for a DLC thin film on a glass substrate.

A method of forming an optically-transparent thin film such as a diamond-like carbon or silicon oxynitride thin film comprises providing a defect-containing thin film on a substrate and irradiating the defect-containing thin film with ultraviolet radiation to reduce a concentration of the defects within the film.

A variety of deposition techniques can be used to form the thin film on a substrate, including physical and chemical vapor deposition methods. An example deposition method is plasma enhanced chemical vapor deposition (PECVD).

For instance, an RF (3 kW, 13.56 MHz excitation) parallel plate Dynavac® (PECVD) diamond-like carbon deposition system was used to form DLC thin films on various glass substrates. The Dynavac® system includes a 24 inch diameter, water cooled cathode and a 19 inch diameter platen for supporting a substrate.

Thin film samples were prepared using argon as a working gas and butane as a carbon source. Typical deposition conditions include a base pressure of 25 mTorr, and a bias between the electrode and the platen of about 750V. The reactor (substrate) temperature was about room temperature (~24° C.) at the beginning of each deposition, and increased to a maximum temperature of about 50° C. as the deposition proceeded.

During the deposition, according to various embodiments, the substrate temperature can be less than 400° C., i.e., less than 400, 300, 200, 100, 80, 60 or 40° C.

A summary of the deposition conditions, including deposition time, RF power, butane flow and the resulting thin film thickness is presented in Table 1.

TABLE 1

Example deposition conditions for DLC thin films on glass substrates

| Run # | Deposition Time (min) | RF power (W) | Butane flow rate (sccm) | Film thickness (nm) | Deposition rate (nm/min) |
|---|---|---|---|---|---|
| 1 | 12 | 2000 | 15 | 262 | 21.8 |
| 2 | 24 | 2000 | 15 | 528 | 22 |
| 3 | 58 | 2000 | 15 | 1244 | 21.4 |
| 4 | 24 | 3000 | 10 | 439 | 18.3 |

TABLE 1-continued

Example deposition conditions for DLC thin films on glass substrates

| Run # | Deposition Time (min) | RF power (W) | Butane flow rate (sccm) | Film thickness (nm) | Deposition rate (nm/min) |
|---|---|---|---|---|---|
| 5 | 6 | 3000 | 15 | 147 | 24.5 |
| 6 | 24 | 1000 | 15 | 390 | 16.3 |
| 7 | 6 | 3000 | 25 | 152 | 25.3 |

The average film thickness, depending on the deposition run, varied from about 100 to 5000 nm, e.g., from about 150 to 1500 nm. The as-deposited thin films, which were slightly yellowed in color, were measured using an inVia Raman microscope (Renishaw, Inc.). The dominant observed peak is the so-called "G" peak that is related to sp2 graphitic modes in the DLC material. The Raman data were gathered at 442 nm and 514 nm. Measurements were recorded at two different wavelengths in order to assess the shift in the G-peak position with excitation energy. The dispersion, i.e., the relative shift in the G-peak position, can be used to determine the nature of the atomic bonding (sp2 versus sp3) as well as the residual hydrogen content within the films. The dispersion is calculated as the change in the G-peak position divided by the change in the associated probing wavelength.

Referring to Table 1, and in particular runs 1-3, film thickness is a linear function of deposition time, with a corresponding deposition rate of about 22 nm/min. As seen with reference to runs 3, 5 and 6, the deposition rate increased with RF power, from about 16 nm/min at 1000 W to about 24.5 nm/min at 3000 W. The deposition rate appears to saturate at about 25 nm/min with increasing butane flow (runs 4, 5 and 7).

Typical Raman spectra for DLC thin films on glass substrates are shown in FIG. 1. The illustrated data are for run 3. Referring to FIG. 1, the G-band for 442 nm excitation is positioned at about 1525 cm$^{-1}$ and the G-band for 514 nm excitation is positioned at about 1550 cm$^{-1}$. The corresponding dispersion, D, is about 0.34 cm$^{-1}$/nm ((1550-1525)/(514-442)). The full-width at half maximum (FWHM) for the G-band is about 125 to 150 cm$^{-1}$.

The position of the G-band, as well as the associated FWHM measurement, suggest a hydrogen content in the thin films of as much as about 30% (e.g., 30, 35, 40 or 45%) and a sp3 composition in the range of 60 to 80%. Based on the foregoing, the atomic microstructure of the DLC thin films is presumed to lie between polymeric-like carbon-hydrogen (PLCH)-type DLC and diamond-like carbon hydrogen (DLCH) forms.

Figure 2:
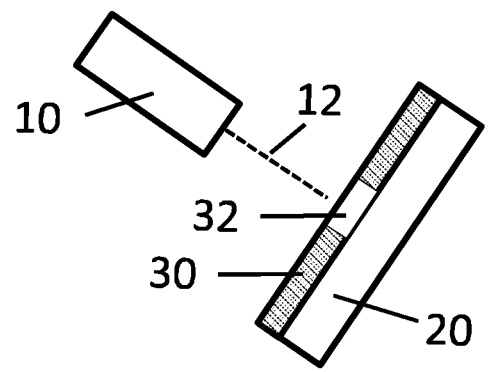
FIG. 2 is a schematic showing the UV-irradiation of a defect-containing thin film.

The as-formed thin film samples were exposed to UV radiation from a pulsed KrF laser (248 nm). For instance, with reference to FIG. 2, the DLC thin films 30 on a glass substrate 20 were exposed to short but intense pulses of 248 nm light from laser source 10. The UV output 12 was at a 10 Hz repetition rate, 100 mJ per pulse, and with a pulse duration of about 25 ns. In an example bleaching run, the beam area was expanded to about 1 cm$^2$, which corresponds to a pulse of about 400,000 J/s. A total irradiation time was about 2 to 5 minutes.

The irradiated region 32 was optically transparent and water clear. Without wishing to be bound by theory, the UV radiation is believed to selectively ablate graphitic content from a near-surface region of the film and/or induce a phrase transformation of the graphitic content into a clear DLC phase. Color-inducing defects may absorb UV radiation. The absorption may excite the defects to a higher energy state where they may react with neighboring atoms in the thin film to form a less color-inducing material such as diamond. Furthermore, the process is readily scalable using commercially-available laser recrystallization apparatus.

Figure 3:
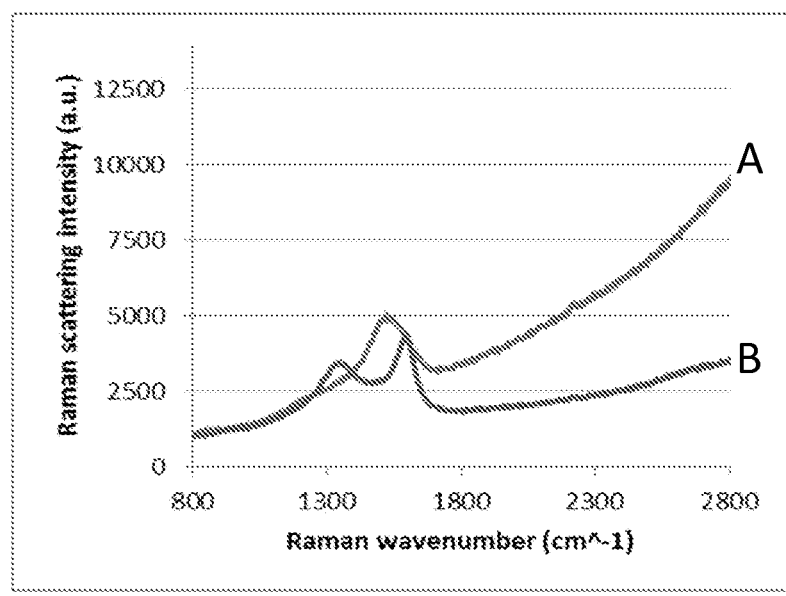
FIG. 3 shows Raman spectra for (A) a defect-containing DLC thin film, and (B) a UV-irradiated DLC thin film.

The Raman spectrum of a pre-irradiated sample (A) is compared to that of a post-irradiated sample (B) in FIG. 3. The Raman spectroscopy of the UV-treated sample shows a well-defined, defected diamond peak near 1350 cm$^{-1}$ and a lower intensity background (extending beyond 2500 cm$^{-1}$) than the untreated thin film. This background peak (or hill) than extends from about 1800 to 2800 in FIG. 3 is related to 2-dimensional (2-D) carbon networks such as graphite. As shown clearly in FIG. 3, the contribution of the 2-D (sp2 hybridization) component to the Raman spectrum was considerably reduced after exposure to UV radiation.

In addition to glass substrates, because the thin film deposition is performed at a relatively low temperature, additional temperature-sensitive substrate materials may include metals, plastics or biomaterials such as wood. Advantageously, glass substrates can be non-UV absorbing.

A total time for forming an optically-transparent thin film, which can include the time for both forming and UV irradiating, can be less than 60 min, i.e., less than 60, 50, 40, 30, 20, 10 or 5 min. The respective acts of thin film formation and UV irradiation can be performed sequentially in one or a plurality of cycles. For instance, in one embodiment, a thin film having a desired thickness can be formed on a substrate and then treated by UV irradiation in a subsequent bleaching step.

In a further embodiment, a thin film having a percentage of a desired total thickness can be formed on a substrate, where the thus formed film is treated by UV irradiation and then further thin film deposition is carried out on the previously UV-treated layer. In this way, the volume of thin film material treated in the UV irradiation step can be controlled, i.e., to less than the final volume of the thin film. For example, the defect-containing thin film that is irradiated can have a thickness of less than 5000 nm, i.e., a thickness of about 100, 200, 400, 500 or 1000 nm. In still embodiments, the deposition and irradiation can be performed simultaneously.

The UV irradiation can increase the optical transparency of the treated thin film to at least 90%, e.g., at least 90, 92, 95, 98 or 99%.

Disclosed herein is a method for forming an optically-transparent thin film, such as a diamond-like carbon or silicon oxynitride thin film. The method involves initially forming a defect-containing thin film using a relatively low temperature deposition process, and then subsequently reducing a concentration of defects in the thin film by irradiating the thin film with UV light. The UV-treated thin film has improved optical transparency compared to the as-deposited thin film.

As used herein, the singular forms "a," "an" and "the" include plural referents unless the context clearly dictates otherwise. Thus, for example, reference to a "diamond like carbon thin film" includes examples having two or more such "thin films" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It is also noted that recitations herein refer to a component being "configured" or "adapted to" function in a particular way. In this respect, such a component is "configured" or "adapted to" embody a particular property, or function in a particular manner, where such recitations are structural recitations as opposed to recitations of intended use. More specifically, the references herein to the manner in which a component is "configured" or "adapted to" denotes an existing physical condition of the component and, as such, is to be taken as a definite recitation of the structural characteristics of the component.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a glass substrate that comprises a glass material include embodiments where a glass substrate consists of a glass material and embodiments where a glass substrate consists essentially of a glass material.

It will be apparent to those skilled in the art that various modifications and variations can be made to the present disclosure without departing from the spirit and scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

I claim:

1. A method of forming an optically-transparent thin film, comprising,
   providing a color-inducing defect-containing diamond-like carbon or silicon oxynitride thin film having an optical transparency on a substrate, wherein the color-inducing defect-containing thin film comprises graphitic defects; and
   increasing the optical transparency of the color-inducing defect-containing diamond-like carbon or silicon oxynitride thin film to at least 90% by irradiating the color-inducing defect-containing thin film with ultraviolet radiation to reduce the concentration of the color-inducing defects within the color-inducing defect-containing thin film.

2. The method according to claim 1, wherein providing a color-inducing defect-containing diamond-like carbon or silicon oxynitride thin film on a substrate comprises forming the color-inducing defect-containing thin film on the substrate via plasma enhanced chemical vapor deposition.

3. The method according to claim 1, wherein providing a color-inducing defect-containing diamond-like carbon or silicon oxynitride thin film on a substrate comprises forming the color-inducing defect-containing thin film on the substrate via RF-PECVD.

4. The method according to claim 1, wherein providing a color-inducing defect-containing diamond-like carbon or silicon oxynitride thin film on a substrate comprises forming the color-inducing defect-containing thin film on the substrate at a deposition temperature of less than about 400° C.

5. The method according to claim 1, wherein providing a color-inducing defect-containing diamond-like carbon or silicon oxynitride thin film on a substrate comprises forming the color-inducing defect-containing thin film on the substrate at a deposition temperature of less than about 100° C.

6. The method according to claim 1, wherein the substrate comprises a material selected from the group consisting of glass, plastic, wood and metal.

7. The method according to claim 1, wherein the substrate is a glass substrate.

8. The method according to claim 1, wherein a source of the ultraviolet radiation is a KrF pulsed laser.

9. The method according to claim 1, wherein the ultraviolet radiation has a wavelength of about 248 nm.

10. The method according to claim 1, wherein the ultraviolet radiation comprises laser radiation and irradiating the color-inducing defect-containing thin film with ultraviolet radiation further comprises scanning the ultraviolet radiation over a surface of the color-inducing defect-containing thin film.

11. The method according to claim 1, wherein the color-inducing defect-containing thin film is irradiated for less than 5 min.

12. The method according to claim 1, wherein an irradiated region of the optically-transparent thin film is substantially free of graphite.

13. The method according to claim 1, wherein the optically-transparent thin film has a thickness of from about 100 nm to about 5000 nm.

* * * * *